(12) United States Patent
Wako

(10) Patent No.: US 11,862,361 B2
(45) Date of Patent: Jan. 2, 2024

(54) CONDUCTIVE LAMINATE, OPTICAL DEVICE USING SAME, AND PRODUCTION METHOD FOR CONDUCTIVE LAMINATE

(71) Applicant: DEXERIALS CORPORATION, Tochigi (JP)

(72) Inventor: Hitoshi Wako, Tochigi (JP)

(73) Assignee: DEXERIALS CORPORATION, Tochigi (JP)

( * ) Notice: Subject to any disclaimer, the term of this patent is extended or adjusted under 35 U.S.C. 154(b) by 15 days.

(21) Appl. No.: 17/624,148

(22) PCT Filed: Jun. 26, 2020

(86) PCT No.: PCT/JP2020/025305
§ 371 (c)(1),
(2) Date: Dec. 30, 2021

(87) PCT Pub. No.: WO2021/002295
PCT Pub. Date: Jan. 7, 2021

(65) Prior Publication Data
US 2022/0367084 A1    Nov. 17, 2022

(30) Foreign Application Priority Data

Jul. 3, 2019  (JP) .................................. 2019-124245

(51) Int. Cl.
*H01B 5/14*  (2006.01)
*G06F 3/041*  (2006.01)
(Continued)

(52) U.S. Cl.
CPC ............... *H01B 5/14* (2013.01); *B32B 33/00* (2013.01); *C23C 14/086* (2013.01); *C23C 28/30* (2013.01);
(Continued)

(58) Field of Classification Search
None
See application file for complete search history.

(56) References Cited

U.S. PATENT DOCUMENTS

| 8,199,406 B2 | 6/2012 | Takenaka et al. |
| 10,540,045 B2 | 1/2020 | Shingai et al. |

(Continued)

FOREIGN PATENT DOCUMENTS

| JP | 2011-175249 A | 9/2011 |
| JP | 4820738 B2 | 11/2011 |

(Continued)

OTHER PUBLICATIONS

Aug. 16, 2022, Japanese Office Action issued for related JP Application No. 2019-124245.

*Primary Examiner* — Katie L. Hammer
(74) *Attorney, Agent, or Firm* — Paratus Law Group, PLLC

(57) ABSTRACT

Provided are a conductive laminate capable of achieving both high transmittance and low electric resistance, and various optical devices equipped with the same. A conductive laminate (1) includes a first transparent material layer (3), a metal layer (4) mainly composed of silver, and a second transparent material layer (5) laminated on at least one surface of a transparent substrate (2) in this order from the side of the transparent substrate (2), wherein the first transparent material layer (3) is composed of a zinc-free metal oxide, the second transparent material layer (5) is composed of a zinc-containing metal oxide, and the metal layer (4) has a thickness of 7 nm or more.

10 Claims, 2 Drawing Sheets

(51) Int. Cl.
 *H01B 1/02* (2006.01)
 *H01B 3/18* (2006.01)
 *H01B 13/00* (2006.01)
 *B32B 33/00* (2006.01)
 *C23C 14/08* (2006.01)
 *C23C 28/00* (2006.01)
 *G02F 1/1677* (2019.01)
 *G02B 1/04* (2006.01)
 *H01Q 1/38* (2006.01)

(52) U.S. Cl.
 CPC ............ *C23C 28/32* (2013.01); *C23C 28/345* (2013.01); *G06F 3/041* (2013.01); *G06F 3/0412* (2013.01); *H01B 1/02* (2013.01); *H01B 3/18* (2013.01); *H01B 13/0013* (2013.01); *B32B 2307/412* (2013.01); *B32B 2457/208* (2013.01); *G02B 1/04* (2013.01); *G02F 1/1677* (2019.01); *H01Q 1/38* (2013.01)

(56) References Cited

U.S. PATENT DOCUMENTS

| | | | |
|---|---|---|---|
| 2005/0095449 A1 | 5/2005 | Yanagisawa et al. | |
| 2018/0113529 A1* | 4/2018 | Shingai | B32B 15/08 |

FOREIGN PATENT DOCUMENTS

| | | |
|---|---|---|
| JP | 2014-034701 A | 2/2014 |
| JP | 2016-207027 A | 12/2016 |
| WO | WO 2005/020655 A1 | 3/2005 |

\* cited by examiner

CONDUCTIVE LAMINATE, OPTICAL DEVICE USING SAME, AND PRODUCTION METHOD FOR CONDUCTIVE LAMINATE

TECHNICAL FIELD

This technology relates to a conductive laminate used in a touch panel, a light control element, an electrophoretic optical element, and a light emitting element, among others. This application is a National Stage Patent Application of PCT International Patent Application No. PCT/JP2020/025305, filed on Jun. 26, 2020 under 35 U.S.C. § 371, which claims priority based on Japanese Patent Application No. 2019-124245, filed on Jul. 3, 2019 in Japan, the entire contents of which are incorporated herein by reference.

BACKGROUND ART

Conventionally, transparent and electrically conductive materials have been utilized in a variety of optical devices. Examples include a touch panel which is laminated on an image display device and detects a touched position based on a change in capacitance, a light control element which electrically variably adjusts a strong external light by utilizing electrochromic phenomena, a light emitting element which utilizes electroluminescence phenomena, and an electrophoretic optical element which controls fine particles having charges dispersed in a liquid by an electric field.

The electrodes used in these optical devices are required to be optically transparent, and it is necessary to increase electric conductivity due to operational reasons.

Therefore, there is required a material that is transparent and has low electric resistance. As a material of this kind, ITO, which is a composite oxide of indium and tin, is widely used and has already occupied a large position in the market.

However, in order to reduce the resistance value and enhance the transparency of ITO, it is necessary to form a film at a high temperature or to apply a heat treatment after the film formation, so that there has been a problem when it is used for substrates or elements that are weak to heat.

For this reason, materials with low resistance and high transparency without heating are developed, and there has been studied the use of zinc oxides such as Zn—O, In—Zn—O (IZO), Al—Zn—O (AZO), and Sn—Zn—O (ZTO) as a substitute for ITO.

Among zinc-based oxides, AZO and ZTO are preferred because they do not contain indium, which is a concern for human health.

Here, in a plasma television or the like, electromagnetic waves are emitted from the screen due to the configuration of the device. Various kinds of transparent materials have been developed to absorb the electromagnetic waves, and it was found that a laminate made by sandwiching a very thin silver thin film with transparent materials having a high refractive index was very effective, and research and development for these materials were widely carried out.

This laminate achieves high transmittance and low resistance by having electrical conductivity with silver and by suppressing the surface reflection to increase the transmittance by the optical interference effect between the high refractive index material and the silver.

In some cases, this laminate is applied to the above-mentioned optical devices.

CITATION LIST

Patent Literature

Patent document 1: Japanese Patent No. 4820738

Non-Patent Literature

Non-Patent Document 1: Appl. Phys. A (2014) 116:1287-1291

SUMMARY OF INVENTION

Technical Problem

As described above, a transparent conductive film having both transmissivity and conductivity can be used in various applications; however, lower resistance and higher transmittance are required for power saving and high-speed operation of the elements. However, in the case of a metal oxide such as ITO, it is necessary to increase the thickness of the film in order to decrease the resistance value, and it is difficult to obtain sufficient properties because the transmittance decreases when increasing the film thickness.

In addition, a laminate having high transmittance and low resistance can be realized in optical simulation based on the combination of materials and the design of the film thicknesses, and the simulation shows that light is absorbed by the silver film so that it is preferable to reduce the thickness of silver.

However, in practice, when the film is formed, even if the thickness of the silver is changed, the amount of light absorbed does not change, and the light absorption, which is not related to the thickness, is revealed to be the main factor that greatly affects the overall transmittance.

Therefore, it was difficult to obtain a transparent conductive film having a transmittance of more than 90% and a surface resistance of 20 Ω/square or less.

Accordingly, the present technology has been developed in view of the above problems, and an object thereof is to provide a conductive laminate capable of achieving both high transmittance and low electric resistance, various optical devices provided with the conductive laminate, and a method for manufacturing the conductive laminate.

Solution to Problem

As a result of intensive research to solve the above problems, the present inventors have found that, in a conductive laminate in which a first transparent material layer, a metal layer mainly composed of silver, and a second transparent material layer are laminated on at least one surface of a transparent substrate in this order from the transparent substrate side, forming the first transparent material layer with a zinc-free metal oxide and forming the second transparent material layer with a zinc-containing metal oxide can suppress the light absorption and achieve high transmittance and low electric resistance of the laminate, thereby completing the present invention.

In other words, a conductive laminate according to the present technology includes: a transparent substrate; and a first transparent material layer, a metal layer mainly composed of silver, and a second transparent material layer laminated on at least one surface of the transparent substrate in this order from the transparent substrate side, wherein the first transparent material layer is composed of a zinc-free metal oxide, wherein the second transparent material layer is composed of a zinc-containing metal oxide, and wherein the metal layer has a thickness of 7 nm or more.

An optical device according to the present technology is configured by using at least one conductive laminate described above.

A method for manufacturing a conductive laminate according to the present technology includes a step of laminating a first transparent material layer, a metal layer mainly composed of silver, and a second transparent material layer on at least one surface of a transparent substrate in this order from the transparent substrate side, wherein the first transparent material layer is composed of a zinc-free metal oxide, wherein the second transparent material layer is composed of a zinc-containing metal oxide, and wherein the metal layer has a thickness of 7 nm or more.

Advantageous Effects of Invention

According to the present technology, by forming, on a substrate, a zinc-free first transparent material layer, silver or a silver alloy layer, and a zinc-containing second transparent material layer, it is possible to suppress formation of a light absorbing layer at an interface and to provide a conductive laminate having low electric resistance and high transmittance.

As a result, the present technology provides a conductive laminate having a low electric resistance and a high transmittance, and this conductive laminate can be applied as an electrode of various optical devices such as a high performance touch panel, a light control element, an electrophoretic element, and a light emitting element, among others, having a low power consumption and a high transmittance.

MODE FOR CARRYING OUT THE INVENTION

Figure 1:
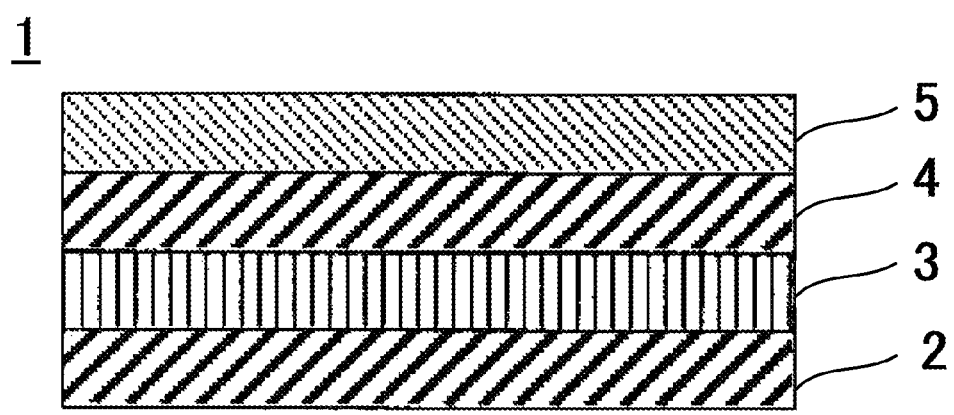
FIG. 1 is a cross-sectional view schematically illustrating a configuration of a conductive laminate according to the present technology.

Hereinafter, a conductive laminate according to the present technology, an optical device using the same, and a method for manufacturing the conductive laminate will be described in detail with reference to the drawings. It should be noted that the present disclosure is not limited to the following embodiments and various modifications can be made without departing from the scope of the present disclosure. Moreover, the features illustrated in the drawings are shown schematically and are not intended to be drawn to scale. Actual dimensions should be determined in consideration of the following description. Furthermore, those skilled in the art will appreciate that dimensional relations and proportions may be different among the drawings in certain parts.

Conductive Laminate

FIG. 1 is a cross-sectional view schematically illustrating a configuration of a conductive laminate 1 according to the present technology. As shown in FIG. 1, the conductive laminate 1 is a conductive laminate in which a first transparent material layer 3, a metal layer 4 mainly composed of silver, and a second transparent material layer 5 are laminated on at least one surface of a transparent substrate 2 in this order from the transparent substrate 2 side, in which the first transparent material layer 3 is composed of a zinc-free metal oxide, and the second transparent material layer 5 is composed of a zinc-containing metal oxide.

The respective layers 3 to 5 of the conductive laminate 1 can be formed by sputtering, which is one of vacuum deposition techniques. The inventors of the present invention conducted a study by laminating various transparent materials and silver by sputtering, and found that an absorption layer causing light absorption (hereinafter referred to as a "light absorbing layer") was formed at the interface between the transparent material and silver. In addition, it was found that there were two interfaces between the first transparent material layer 3 and the silver constituting the metal layer 4 and between the silver constituting the metal layer 4 and the second transparent material layer 5, respective light absorbing layers existed at each of the interfaces, and the formation mechanisms of each of the light absorbing layers were different.

The first light absorbing layer between the first transparent material layer 3 and the silver constituting the metal layer 4 is formed when the first transparent material layer 3 is formed on the transparent substrate 2 and then silver is formed by sputtering or the like. In other words, when the silver atoms jumped out from the target at a high speed reach the transparent substrate 2, they lose kinetic energy and are fixed to the surface. At that time, when the interaction with the metal constituting the first transparent material layer 3 is strong, the first transparent material layer 3 is alloyed to form a light absorbing layer (first light absorbing layer). Zinc easily forms a light absorbing layer since it has a wide solid solution region with silver and strongly interacts with silver. In general, stronger interaction will suppress the island formation on the surface of silver to suppress the absorption by the silver islands, but when the layer is formed, a certain amount of the light absorbing layer is also formed there.

When a metal oxide of a metal such as Nb, Ti, Zr, Hf, Ta, W, or Mo, which is less interactive with silver, is used as the first transparent material constituting the first transparent material layer 3, a very thin silver film would form an island structure and increase light absorption; however, it has been found that laminating silver with a certain thickness or more will reduce light absorption by silver alone without forming a first light absorbing layer by an alloy layer with the first transparent material. The minimum film thickness for this purpose was found to be 7 nm or more.

The second light absorbing layer between silver constituting the metal layer 4 and the second transparent material layer 5 might be formed when the second transparent material layer 5 is formed on the metal layer 4 by sputtering or the like. In other words, although metal elements constituting the second transparent material layer 5 and oxygen atoms reach the surface of the transparent substrate 2 the surface of which is covered with silver, weak interaction between the silver and the metal element would cause insufficient wetting and spreading of the second transparent material layer 5 and would form a large number of small voids at the interface, the voids causing light absorption. On the contrary, a zinc-containing metal oxide used as the second transparent material improves wettability on the surface of the transparent substrate 2 covered with silver, thereby forming an excellent interface. In addition, since the strong bonding between zinc and oxygen would cause zinc to be an oxide film before forming an alloy with silver, it is possible to avoid the formation of a light absorbing layer (second light absorbing layer) by the alloy layer.

At present, the practicable conductive oxide constituting the second transparent material layer 5 is a zinc oxide and a zinc alloy composite oxide, and it can be said that the zinc oxide and the zinc alloy composite oxide are preferable since they have good contact resistance when the electric charge is substantially transferred from the outside to the surface of the conductive laminate 1.

As described above, by using, as a first transparent material constituting the first transparent material layer 3, a zinc-free transparent material, or industrially, an oxide or composite oxide of metals such as Nb, Ti, Zr, Hf, Ta, W, and Mo, depositing the first transparent material on the transparent substrate 2 by sputtering or the like, depositing silver as the metal layer 4 by sputtering or the like to a thickness of 7 nm or more, and depositing a zinc-containing oxide as a second transparent material constituting the second transparent material layer 5 by sputtering or the like, in other words, by laminating these layers in this order, it is possible to suppress light absorption at the interfaces between each of the layers 3 to 5 to obtain the conductive laminate 1 having a high transmittance.

It is desired that the first transparent material constituting the first transparent material layer 3 contains no zinc, and a high refractive index material having a refractive index of 1.8 or more is preferable because reflection of the surface is suppressed by optical interference. Examples include oxides of Nb, Ti, Zr, Hf, Ta, W, and Mo, and composite oxides thereof. Further, one or more other types of elements may be added within a range not exceeding 50 atom % to these elements.

The metal layer 4 is a metal layer containing silver as a main component, and this may be pure silver or additive elements may be added in a range not exceeding 10 atom % in total. In other words, in the present technology, the silver as a main component means both of silver of 90 atom % or more and pure silver. In addition, the silver layer preferably has a thickness of 7 nm or more because a thickness less than 7 nm tends to form an island-like film. The upper limit of the silver layer thickness is not particularly limited, but is preferably less than 15 nm. A film thickness of 15 nm or more will make the light absorption inside the silver layer larger than the absorption at the interface, which may degrade the effect of the present technology.

The second transparent material constituting the second transparent material layer 5 desirably contains zinc, and one or more kinds of materials may be added in a range not exceeding 50 atom % from the viewpoints of optical properties, electrical conductivity, and chemical stability.

In this way, by forming the zinc-free first transparent material on the transparent substrate 2, depositing silver or a silver alloy, and then forming a zinc-containing second transparent material, the present technology can suppress the formation of a light absorbing layer at each interface and achieve the conductive laminate 1 having low electric resistance and high transmittance. The conductive laminate 1 according to the present technology has low electric resistance and high transmittance. Therefore, the present technology can provide a power saving and high performance optical device using at least one conductive laminate, for example, a touch panel, a light control element, an electrophoretic optical element, a light emitting element, an antenna or the like that uses the conductive laminate as at least one pole of an electrode.

Hereinafter, each layer constituting the conductive laminate 1 will be described in detail. As described above, in the conductive laminate 1 according to the present technology, a first transparent material layer 3, a metal layer 4 mainly composed of silver, and a second transparent material layer 5 are laminated on at least one surface of the transparent substrate 2 in this order from the transparent substrate 2 side.

Transparent Substrate

The transparent substrate 2 of the present disclosure may be composed of either a glass substrate or a resin film. The transparent substrate 2 composed of a resin film can be manufactured by a roll-to-roll method so as to improve production efficiency.

The material of such resin film is not particularly limited, and may be, for example, polyethylene terephthalate (PET), polyethylene naphthalate (PEN), polyaramid, polyimide, polycarbonate, polyethylene, polypropylene, triacetylcellulose (TAC), and polycycloolefin (COC, COP), among others.

The thickness of the transparent substrate 2 is not particularly limited, but in the case of the resin film, it is preferable to set the thickness to 20 µm or more and 200 µm or less in consideration of ease of handling in manufacturing and thinning of the member.

In the conductive laminate 1 according to the present technology, the transparent substrate 2 preferably has a light transmittance of 88% or more.

In order to improve the scratch resistance of the transparent substrate 2, thin films of, for example, acrylic resin may be formed on both surfaces of the transparent substrate 2 by, for example, solution coating.

First Transparent Material Layer

The first transparent material layer 3 is composed of a zinc-free metal oxide, and an oxide of a material which is less interactive with silver, such as oxides of Nb, Ti, Zr, Hf, Ta, W, and Mo can be preferably used. These may be a composite oxide containing one or more elements, or may contain elements other than zinc at a concentration of 50 atom % or less. The thickness of the first transparent material layer 3 is not particularly limited, and can be set to a film thickness having the highest transmittance according to the material configuration. The first transparent material layer 3 may have an actual thickness in the range of, for example, 30 to 80 nm.

The method of forming the first transparent material layer 3 is not particularly limited, but it is preferable to use a sputtering method in order to improve production efficiency and equalize the film thickness distribution.

The first transparent material layer 3 may be formed as a plurality of layers from the viewpoint of moisture-proof property. In this case, at least the transparent material layer in contact with the metal layer 4 is preferably composed of a zinc-free metal oxide such as oxides of Nb, Ti, Zr, Hf, Ta, W, or Mo which is less interactive with silver.

Metal Layer

The metal layer 4 laminated on the first transparent material layer 3 is a metal layer mainly composed of silver. Additional elements may be added to the metal layer 4 in a range not exceeding 10 atom % as a whole. In other words, the metal layer 4 according to the present technology is composed of 90 atom % or more of silver or pure silver.

The metal layer 4 preferably has a thickness of 7 nm or more. A film thickness of less than 7 nm tends to form an island-like film and might inhibit light transmittance. The upper limit of the film thickness is not particularly limited, but a film thickness of 15 nm or more will make the light absorption inside the silver layer larger than the absorption at the interface, which may degrade the effect of the present invention.

Although the method of forming the metal layer 4 is not particularly limited, it is preferable to use a sputtering method from the viewpoint of continuously forming the second transparent material layer 5 after forming the metal layer 4, improving production efficiency, and equalizing the film thickness distribution.

Second Transparent Material Layer

The second transparent material layer 5 laminated on the metal layer 4 is composed of an zing-containing oxide. The second transparent material layer 5 may contain one or more elements other than zinc in a range not exceeding 50 atom % from the viewpoints of optical properties, electrical conductivity, and chemical stability. The thickness of the second transparent material layer 5 is not particularly limited, and can be set to a film thickness having the highest transmittance according to the material configuration. An actual thickness of the second transparent material layer 5 may be in a range of, for example, 30 to 70 nm.

The method of forming the second transparent material layer 5 is not particularly limited, but it is preferable to use a sputtering method in order to continuously form the second transparent material layer 5 after the formation of the metal layer 4, improve the production efficiency, and equalize the film thickness distribution.

The second transparent material layer 5 may be formed as a plurality of layers from the viewpoint of scratch resistance property. In this case, at least the transparent material layer in contact with the metal layer 4 may be of a zinc-containing oxide, and one or more elements may be added thereto in a range not exceeding 50 atom % from the viewpoints of optical properties, electrical conductivity, and chemical stability. Other layers are also preferably formed of a transparent oxide having electrical conductivity in order to maintain excellent electrical conductivity.

Although the conductive laminate 1 shown in FIG. 1 is formed by laminating the first transparent material layer 3, the metal layer 4, and the second transparent material layer 5 on one surface of the transparent substrate 2, in the conductive laminate 1 according to the present technology, the first transparent material layer 3, the metal layer 4 and the second transparent material layer 5 may be laminated on the other surface of the transparent substrate 2 or on both surfaces of the transparent substrate 2.

Manufacturing Steps of Conductive Laminate

The conductive laminate 1 described above can be manufactured by laminating the first transparent material layer 3, the metal layer 4 mainly composed of silver, and the second transparent material layer 5 on at least one surface of the transparent substrate 2 in this order from the transparent substrate 2 side.

Figure 2:
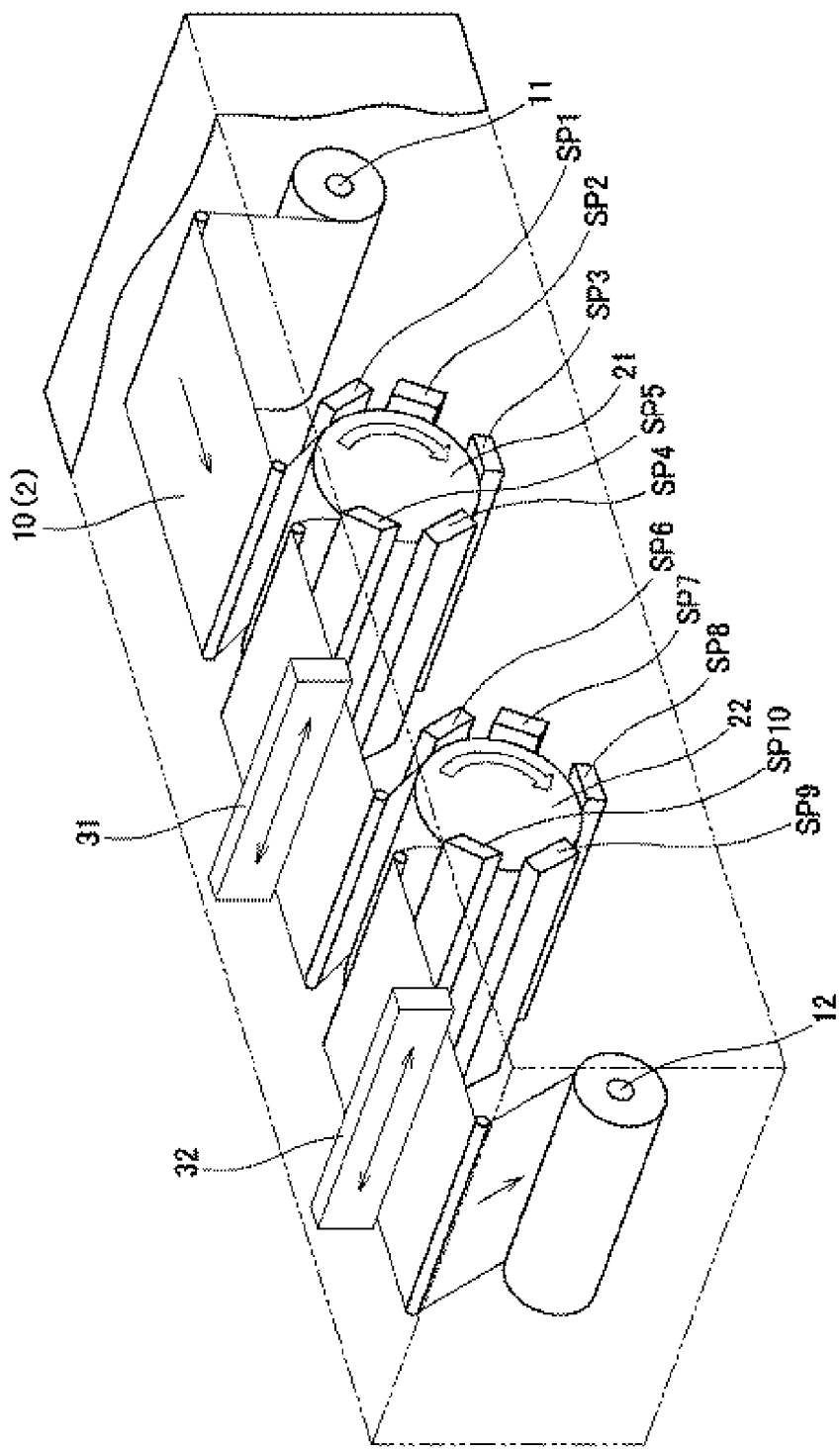
FIG. 2 is a perspective view illustrating an internal configuration of a thin film forming apparatus.

The first transparent material layer 3, the metal layer 4, and the second transparent material layer 5 may be formed by using, for example, a thin film forming apparatus disclosed in Japanese Unexamined Patent Application Publication No. 2014-34701. FIG. 2 is a perspective view illustrating an internal configuration of a thin film forming apparatus disclosed in Japanese Unexamined Patent Application Publication No. 2014-34701. This thin film forming apparatus forms a film on a film substrate by sputtering with a roll-to-roll method, allowing a plurality of sputtering targets to be placed, and allowing a plurality of kinds of different materials to be formed while maintaining a vacuum atmosphere once the roll is set.

In addition, at the time of sputtering, this thin film forming apparatus can introduce oxygen gas into the plasma in addition to argon gas used as a sputtering gas, thereby forming the oxide of the target material on the film base material.

Hereinafter, the structure of the thin film forming apparatus will be described in detail. The thin film forming apparatus is provided with: a measuring unit to which a base film is continuously supplied in the longitudinal direction to measure optical properties in the width direction of a thin film formed on the base film; a supply unit provided with a plurality of gas nozzles in the width direction of the base film to supply reactive gas near the target; and a control unit to control the flow rate of reactive gas ejected from each gas nozzle based on the optical properties in the width direction measured by the measuring unit, thereby forming a thin film of uniform thickness in the longitudinal direction and the width direction.

Further, a specific configuration may preferably be provided with a film forming part including: a supply unit, a sputtering electrode for applying a voltage to a target, and a plasma measuring unit for measuring the emission spectrum of the plasma in the width direction of the substrate film during film formation. With this configuration, the control unit can control the flow rate of the reactive gas ejected from each gas nozzle and the voltage applied to the target on the basis of the optical properties in the width direction measured by the measuring unit and the emission spectrum measured by the plasma measuring unit, thereby forming a thin film having a uniform thickness in the width direction.

Further, a specific configuration may include: an unwinding part for winding out the base film in the longitudinal direction, a film forming unit in which a plurality of film forming parts are arranged in the longitudinal direction of the base film, and a winding part for winding the base film in which the thin film is formed in the film forming unit. Thus, a multilayer thin film can be formed during the processes between the unwinding and the winding of the base film. It is preferable to dispose the measuring unit at least after the last film forming part, i.e., between the film forming unit and the winding part, and it is more preferable to dispose a plurality of the measuring units after each of the plurality of the film forming parts, respectively. Thus, the optical properties of both the single-layer thin film and the multi-layer thin film can be measured.

The thin film forming apparatus shown in FIG. 2 feeds a base film serving as a base film while winding it around a can roll to form a thin film on the surface of the base film by sputtering.

In this thin film forming apparatus, a base film 10 (transparent substrate 2) is supplied from an unwinding roll 11 functioning as an unwinding part and the base film 10 having the thin film formed thereon is wound by a winding roll 12 functioning as a winding part. A first film forming chamber unit and a second film forming chamber unit which are film formation units are provided in a vacuum chamber. The vacuum chamber is connected to a vacuum pump for discharging air and can be adjusted to a predetermined degree of vacuum.

The first film forming chamber unit and the second film forming chamber unit are respectively provided with a first can roll 21 and a second can roll 22, and a plurality of sputtering chambers SP1 to SP10 functioning as film forming units are fixed so as to face the outer peripheral surfaces of the can rolls 21, 22. In each of the sputtering chambers SP1 to SP10, a predetermined target is mounted above the electrode, and the supply part having a plurality of gas nozzles in the width direction of the base film 10 is provided.

In addition, the thin film forming apparatus is provided with an optical monitor 31 functioning as the measuring unit for measuring optical properties between the first film forming chamber unit and the second film forming chamber unit, i.e., after film formation by the sputtering chamber SPS. Thus, it is possible to control the film formation on an intermediate product conveyed after the first film forming chamber unit and to reduce the adjustment time for adjusting a single layer. In addition, the thin film forming apparatus is further provided with an optical monitor 32, which is the measuring unit for measuring optical properties after the second film forming chamber unit, i.e., after film formation by the sputtering chamber SP 10. Thus, it is possible to confirm the quality of the final film formation after the second film forming chamber unit.

The optical monitors 31, 32 measure optical properties in the width direction of the thin film formed on the base film 10 by an optical head capable of scanning in the width direction, as will be described later. The optical monitors 31, 32 measure, for example, the peak wavelength of reflectance as an optical property and convert it into an optical thickness to acquire an optical thickness distribution in the width direction.

The thin film forming apparatus having such a constitution can produce a multilayer thin film by feeding the base film 10 from a winding roll 11, forming thin films on the base film 10 conveyed by the first can roll 21 and the second can roll 22, and winding the thin film by the winding roll 12. Here, by measuring optical properties in the width direction of the thin film formed on the base film 10 by using the optical monitors 31, 32, and controlling the flow rate of the reactive gas supplied from each gas nozzle provided in the width direction based on the optical properties, it is possible to form a thin film having a uniform thickness in the longitudinal direction and the width direction.

EXAMPLES

Hereinafter, the present technology will be specifically described with reference to examples and comparative examples, but the present invention is not limited to the following examples.

Example 1

A first transparent material layer, a metal layer, and a second transparent material layer were sequentially formed on a transparent substrate by using a thin film forming apparatus disclosed in Japanese Unexamined Patent Application Publication No. 2014-34701 shown in FIG. 2. A COP film of 50 μm thickness was used as the transparent substrate.

The thin film forming apparatus can simultaneously laminate thin films of a plurality of materials in sequence, and in the present example, targets of niobium oxide, silver, and a composite oxide of zinc-tin are arranged in this order from the side closer to the film unwinding side. Each target is connected to an individual power source and can cause discharge by applying arbitrarily controllable power. Further, each target is housed in an independent container, and the partition wall separating the targets has only a small gap near the can roll, so that a substantially different gas atmosphere can be realized.

A film was formed by a sputtering method by evacuating the entire vacuum chamber of the thin film forming apparatus to $1 \times 10^{-3}$ Pa or less, introducing argon gas into the first cathode part provided with niobium oxide in the vacuum chamber while adjusting the flow rate to be 150 sccm by a mass flow controller, and then applying power to the niobium oxide target to cause discharge. At this time, in order to suppress the light absorption of niobium oxide due to oxygen shortage, 6 sccm of oxygen was added to form a transparent oxide layer. The running speed of the film was 3 m/min. After measuring a relation between the electric power and the film thickness, the electric power was previously adjusted based on the measurement so that niobium oxide with a thickness of 46 nm could be formed at a running speed of 3 m/min.

After niobium oxide was formed at the first cathode part, a silver thin film was formed at the second cathode part. Specifically, a film was formed by a sputtering method by introducing argon gas into the second cathode part in the vacuum chamber while adjusting the flow rate to be 450 sccm by a mass flow controller, and then applying power to the silver target to cause discharge. Although two adjacent cathodes are used in this example, it is not necessary to use two adjacent cathodes. Depending on the configuration of the apparatus, the entire cathode chamber may be used as a partition wall instead of using one cathode chamber. After measuring a relation between the electric power and the film thickness, the electric power was previously adjusted based on the measurement so that silver film with a thickness of 9 nm could be formed at a running speed of 3 m/min.

After a silver thin film was formed at the second cathode part, a zinc-tin composite oxide was formed at the third cathode part. Specifically, a film was formed by a sputtering method by introducing argon gas into the third cathode part of the vacuum chamber while adjusting the flow rate to be 150 sccm by a mass flow controller, and then applying power to the zinc-tin composite oxide target to cause discharge. At this time, a small amount of oxygen was introduced separately from argon gas while adjusting the amount of oxygen by a mass flow controller so as not to cause poor conductivity due to insufficient oxygen or excessive oxygen to obtain an excellent transparent conductive oxide. Although two adjacent cathodes are used in this example, it is not necessary to use two adjacent cathodes. Depending on the configuration of the apparatus, one entire cathode chamber may be used as a partition wall instead of using individual cathode chambers. After measuring a relation between the electric power and the film thickness, the electric power was previously adjusted based on the measurement so that zinc-tin composite oxide with a thickness of 50 nm could be formed at a running speed of 3 m/min.

All the film thicknesses were calculated in advance by computer simulation and designed to have the highest transmittance.

After forming the three layers, a sample was prepared by continuously winding the film having the configure shown in FIG. 1, introducing air into the entire apparatus, and then taking out the sample.

Example 2

A sample was prepared under the same conditions as in Example 1 except that the niobium oxide film thickness was adjusted to 49 nm, the silver film thickness was adjusted to 8 nm, and the zinc-tin composite oxide film thickness was adjusted to 52 nm.

Example 3

A sample was prepared under the same conditions as in Example 1 except that the niobium oxide film thickness was adjusted to 52 nm, the silver film thickness was adjusted to 7 nm, and the zinc-tin composite oxide film thickness was adjusted to 53 nm.

Example 4

A sample was prepared under the same conditions as in Example 1 except that the niobium oxide film thickness was adjusted to 43 nm, the silver film thickness was adjusted to 10 nm, and the zinc-tin composite oxide film thickness was adjusted to 49 nm.

Example 5

A sample was prepared under the same conditions as in Example 1 except that the niobium oxide film thickness was adjusted to 40 nm, the silver film thickness was adjusted to 11 nm, and the zinc-tin composite oxide film thickness was adjusted to 47 nm.

Example 6

A sample was prepared under the same conditions as in Example 1 except that the niobium oxide film thickness was adjusted to 38 nm, the silver film thickness was adjusted to 12 nm, and the zinc-tin composite oxide film thickness was adjusted to 46 nm.

Example 7

A sample was prepared under the same conditions as in Example 1 except that titanium oxide was used as the first transparent material, the film thickness of which was adjusted to 39 nm, the silver film thickness was adjusted to 10 nm, and the zinc-tin composite oxide film thickness was adjusted to 52 nm.

Example 8

A sample was prepared under the same conditions as in Example 1 except that zirconium oxide was used as the first transparent material, the film thickness of which was adjusted to 71 nm, the silver film thickness was adjusted to 7 nm, and the zinc-tin composite oxide film thickness was adjusted to 42 nm.

Example 9

A sample was prepared under the same conditions as in Example 1 except that hafnium oxide was used as the first transparent material, the film thickness of which was adjusted to 62 nm, the silver film thickness was adjusted to 7 nm, and the zinc-tin composite oxide film thickness was adjusted to 47 nm.

Example 10

A sample was prepared under the same conditions as in Example 1 except that tantalum pentoxide was used as the first transparent material, the film thickness of which was adjusted to 58 nm, the silver film thickness was adjusted to 7 nm, and the zinc-tin composite oxide film thickness was adjusted to 50 nm.

Example 11

A sample was prepared under the same conditions as in Example 1 except that tungsten oxide was used as the first transparent material, the film thickness of which was adjusted to 63 nm, the silver film thickness was adjusted to 7 nm, and the zinc-tin composite oxide film thickness was adjusted to 47 nm.

Example 12

A sample was prepared under the same conditions as in Example 1 except that molybdenum oxide was used as the first transparent material, the film thickness of which was adjusted to 65 nm, the silver film thickness was adjusted to 7 nm, and the zinc-tin composite oxide film thickness was adjusted to 48 nm.

Example 13

A sample was prepared under the same conditions as in Example 1 except that the niobium oxide film thickness was adjusted to 51 nm, the silver film thickness was adjusted to 7 nm, and zinc oxide was used as the second transparent material, the film thickness of which was adjusted to 53 nm.

Example 14

A sample was prepared under the same conditions as in Example 1 except that the niobium oxide film thickness was adjusted to 53 nm, the silver film thickness was adjusted to 7 nm, and indium-zinc composite oxide was used as the second transparent material, the film thickness of which was adjusted to 51 nm.

Example 15

A sample was prepared under the same conditions as in Example 1 except that the niobium oxide film thickness was adjusted to 47 nm, the silver film thickness was adjusted to 7 nm, and aluminum-zinc composite oxide was used as the second transparent material, the film thickness of which was adjusted to 58 nm.

Comparative Example 1

A sample was prepared under the same conditions as in Example 1 except that zinc oxide was used as the first transparent material, the film thickness of which was adjusted to 64 nm, the silver film thickness was adjusted to 7 nm, and the zinc-tin composite oxide film thickness was adjusted to 46 nm.

Comparative Example 2

A sample was prepared under the same conditions as in Example 1 except that zinc-tin composite oxide was used as the first transparent material, the film thickness of which was adjusted to 77 nm, the silver film thickness was adjusted to 7 nm, and niobium oxide was used as the second transparent material, the film thickness of which was adjusted to 35 nm.

Comparative Example 3

A sample was prepared under the same conditions as in Example 1 except that the niobium oxide film thickness was adjusted to 55 nm, the silver film thickness was adjusted to 6 nm, and the zinc-tin composite oxide film thickness was adjusted to 54 nm.

Comparative Example 4

A sample was prepared under the same conditions as in Example 1 except that the niobium oxide film thickness was adjusted to 55 nm, the silver film thickness was adjusted to 7 nm, and niobium oxide was used as the second transparent material, the film thickness of which was adjusted to 42 nm.

Comparative Example 5

A sample was prepared under the same conditions as in Example 1 except that zinc oxide was used as the first transparent material, the film thickness of which was adjusted to 64 nm, the silver film thickness was adjusted to 7 nm, and zinc oxide was used as the second transparent material, the film thickness of which was adjusted to 46 nm.

Comparative Example 6

A sample was prepared under the same conditions as in Example 1 except that zinc oxide was used as the first transparent material, the film thickness of which was adjusted to 66 nm, the silver film thickness was adjusted to 7 nm, and indium-zinc composite oxide was used as the second transparent material, the film thickness of which was adjusted to 44 nm.

Comparative Example 7

A sample was prepared under the same conditions as in Example 1 except that zinc oxide was used as the first transparent material, the film thickness of which was adjusted to 58 nm, the silver film thickness was adjusted to 7 nm, and aluminum-zinc composite oxide was used as the second transparent material, the film thickness of which was adjusted to 51 nm.

Comparative Example 8

A sample was prepared under the same conditions as in Example 1 except that zinc oxide was used as the first transparent material, the film thickness of which was adjusted to 74 nm, the silver film thickness was adjusted to 8 nm, and titanium oxide was used as the second transparent material, the film thickness of which was adjusted to 31 nm.

Evaluation Results

Each sample was cut to an arbitrary size and then measured and evaluated. The surface resistance was measured in accordance with "JIS K-7194" by using "Loresta GP (registered trademark) (available from Dia Instruments)".

The total light transmittance was measured in accordance with "JIS K-7105" by using "NDH 5000 (available from Nippon Denshoku Industries)".

The transmittance and reflectance at an incidence angle of 5° were measured by using a spectroscope "U-4100 (available from Hitachi High Technologies)", and the light absorption amount for each value at a wavelength of 550 nm was defined by the following equation (1).

$$\text{Light Absorption (\%)} = 100(\%) - (\text{Transmittance (\%)} + \text{Reflectance (\%)}) \quad (1)$$

In other words, the light which are neither reflected nor transmitted was regarded as being converted into (absorbed as) heat in the thin film and the substrate. In practice, although light absorption may appear to increase because of the substantial reduction in transmittance and reflectance due to scattering or the like, since the substrate used in the present disclosure is extremely small in absorption and has a smooth surface, the light absorption obtained by the above formula (1) can be substantially regarded as the absorption by the laminated films.

In the present disclosure, it is preferable that the surface resistance should be as low as possible and the total light transmittance should be as high as possible. Generally-used ITO (Indium Tin composite Oxide) films usually have a total light transmittance of around 88% at a surface resistance of 100 Ω/square, though this depends on the film thickness of ITO. Therefore, in order to prove the superiority of the present disclosure, the resistance value is preferably 20 Ω/square or less and the total light transmittance is preferably 90% or more.

TABLE 1

| | first transparent material layer | | metal layer (Ag) | | second transparent material layer | | surface resistance (Ω/square) | total light transmittance (%) | light absorption (%) |
|---|---|---|---|---|---|---|---|---|---|
| | material | thickness (nm) | material | thickness (nm) | material | thickness (nm) | | | |
| Ex. 1 | Nb$_2$O$_5$ | 46 | Ag | 9 | Zn—Sn—O | 50 | 9 | 91.4 | 4 |
| Ex. 2 | Nb$_2$O$_5$ | 49 | Ag | 8 | Zn—Sn—O | 52 | 11 | 91.1 | 4 |
| Ex. 3 | Nb$_2$O$_5$ | 52 | Ag | 7 | Zn—Sn—O | 53 | 14 | 90.0 | 5 |
| Ex. 4 | Nb$_2$O$_5$ | 43 | Ag | 10 | Zn—Sn—O | 49 | 8 | 90.5 | 5 |
| Ex. 5 | Nb$_2$O$_5$ | 40 | Ag | 11 | Zn—Sn—O | 47 | 7 | 90.4 | 6 |
| Ex. 6 | Nb$_2$O$_5$ | 38 | Ag | 12 | Zn—Sn—O | 46 | 6 | 90.1 | 8 |
| Ex. 7 | TiO$_2$ | 39 | Ag | 10 | Zn—Sn—O | 52 | 8 | 90.2 | 5 |
| Ex. 8 | ZrO$_2$ | 71 | Ag | 7 | Zn—Sn—O | 42 | 14 | 91.3 | 4 |
| Ex. 9 | HfO$_2$ | 62 | Ag | 7 | Zn—Sn—O | 47 | 14 | 91.5 | 4 |
| Ex. 10 | TaO$_5$ | 58 | Ag | 7 | Zn—Sn—O | 50 | 14 | 91.5 | 4 |
| Ex. 11 | WO$_3$ | 63 | Ag | 7 | Zn—Sn—O | 47 | 14 | 91.4 | 5 |
| Ex. 12 | MoO$_3$ | 65 | Ag | 7 | Zn—Sn—O | 48 | 14 | 91.4 | 5 |
| Ex. 13 | Nb$_2$O$_5$ | 51 | Ag | 7 | ZnO | 53 | 14 | 91.4 | 4 |
| Ex. 14 | Nb$_2$O$_5$ | 53 | Ag | 7 | In—Zn—O | 51 | 14 | 91.0 | 4 |
| Ex. 15 | Nb$_2$O$_5$ | 47 | Ag | 7 | Al—Zn—O | 58 | 14 | 91.6 | 4 |
| Comp. 1 | ZnO | 64 | Ag | 7 | Zn—Sn—O | 46 | 18 | 86.2 | 10 |
| Comp. 2 | Zn—Sn—O | 77 | Ag | 7 | Nb$_2$O$_5$ | 35 | 38 | 87.3 | 8 |
| Comp. 3 | Nb$_2$O$_5$ | 55 | Ag | 6 | Zn—Sn—O | 54 | 120 | 80.3 | 15 |
| Comp. 4 | Nb$_2$O$_5$ | 55 | Ag | 7 | Nb$_2$O$_5$ | 42 | 39 | 89.3 | 7 |
| Comp. 5 | ZnO | 64 | Ag | 7 | ZnO | 46 | 19 | 80.5 | 14 |
| Comp. 6 | ZnO | 66 | Ag | 7 | In—Zn—O | 44 | 16 | 87.0 | 9 |
| Comp. 7 | ZnO | 58 | Ag | 7 | Al—Zn—O | 51 | 17 | 87.5 | 9 |
| Comp. 8 | ZnO | 74 | Ag | 8 | TiO$_2$ | 31 | 15 | 83.5 | 12 |

Examples 1 to 6

As is clear from Table 1, the samples of Examples 1 to 6 exhibit the surface resistance of 30 Ω/square or less, and the total light transmittance of 90% or more. In addition, although the light absorption slightly increases with the increase in the film thickness of silver, it does not significantly affect the total light transmittance, and the present technology contributes to suppress the cause of light absorption as disclosed.

Examples 7 to 12

In comparison with Examples 1 to 6, Examples 7 to 12 shows the properties in the cases in which the first transparent material layer is replaced. As is clear from Table 1, the samples of Examples 7 to 12 exhibit the surface resistance of 30 Ω/square or less and the total light transmittance of 90% or more. In other words, it is understood that, for the effect shown in the present disclosure, the first transparent material layer is not limited to niobium oxide, and the first transparent material layer may be formed with another metal oxide containing no zinc, such as titanium oxide, zirconium oxide, hafnium oxide, tantalum pentoxide, tungsten oxide, and molybdenum oxide, among others.

Examples 13 to 15

Examples 1 to 12 in the present disclosure employs a single film of tin composite oxide having a relatively low resistance value as the second transparent material layer, but the present invention is not limited thereto. In compared with Examples 1 to 6, Examples 13 to 15 shows the properties in the cases in which the second transparent material layer is replaced. As is clear from Table 1, the samples of Examples 13 to 15 exhibit the surface resistance of 30 Ω/square or less and the total light transmittance is 90% or more. In other words, it is understood that the second transparent material layer is not limited to zinc-tin composite oxide, and a transparent conductor containing zinc can exhibits the same effect.

Comparative Example 1

Comparative Example 1 uses zinc oxide as the first transparent material layer. As shown in Table 1, in the sample of Comparative Example 1, the total light transmittance is greatly deteriorated in comparison with Example 3 having the same silver film thickness, and the light absorption is also increased, indicating that using zinc oxide as the first transparent material layer will increase the absorption.

Comparative Example 2

In Comparative Example 2, contrary to the structure shown in Examples 1 to 6, zinc-tin composite oxide was used for the first transparent material layer and niobium oxide was used for the second transparent material layer. As shown in Table 1, the sample of Comparative Example 2 has a lower total light transmittance and an increased light absorption as compared with Example 3 having the same silver film thickness. This implies that the mechanism causing the absorption at the interface between the first transparent material layer and the metal layer (silver) and the mechanism causing the absorption at the interface between the metal layer (silver) and the second transparent material layer are different.

Comparative Example 3

In Comparative Example 3, the structure was the same as in Examples 1 to 6, and the thickness of the metal layer (silver) was changed to be 6 nm. As shown in Table 1, in the sample of Comparative Example 3, reducing the thickness of the metal layer (silver) degraded the effect of the present disclosure since the continuity of the silver thin film could not be maintained, resulting in formation of an island-like structure in the film, so that the surface resistance rapidly increased and the amount of light absorption significantly increased.

Comparative Example 4

In Comparative Example 4, both the first transparent material and the second transparent material were composed of niobium oxide. As shown in Table 1, in the sample of Comparative Example 4, the total light transmittance is degraded in comparison with Example 3 having the same silver film thickness, indicating that using a material containing zinc as the second transparent material will suppress light absorption. In addition, the surface resistance of the niobium oxide also increased because of its low conductivity.

Comparative Examples 5 to 8

In Comparative Examples 5 to 8, zinc oxide was used as the first transparent material layer. As shown in Table 1, the samples of Comparative Examples 5 to 8 exhibits a low total light transmittance, indicating that the total light transmittance could not be improved even if a material other than the zinc-tin composite oxide is used for the second transparent material layer, and that, when the first transparent material is a zinc-containing oxide, a highly transparent film could not be obtained even if the second transparent material is replaced with any material.

As described above, the effects of the present invention could be verified from the results of the examples and the comparative examples. The present invention is not limited to the examples described above. It is obvious that a person having ordinary knowledge in the field of the art to which the present invention belongs can conceive of various alterations or modifications within the scope of the technical idea described in the claims, and it is understood that these also fall naturally within the technical scope of the present invention.

REFERENCE SIGNS LIST 1 conductive laminate, 2 transparent substrate, 3 first transparent material layer, 4 metal layer, 5 second transparent material layer, 10 base film, 11 unwinding roll, 12 winding roll, 21 first can roll, 22 second can roll, 31 optical monitor, 32 optical monitor, SP sputtering chamber

The invention claimed is:
1. A conductive laminate comprising:
a transparent substrate; and
a first transparent material layer, a metal layer mainly composed of silver, and a second transparent material layer laminated on at least one surface of the transparent substrate in this order from the transparent substrate side,
wherein the first transparent material layer is composed of a zinc-free metal oxide,
wherein the second transparent material layer is composed of a zinc-containing metal oxide,
wherein the metal layer has a thickness of 7 nm or more, and
wherein transmittance of the conductive laminate as a whole in a lamination direction is 90% or more.

2. The conductive laminate according to claim 1, wherein the metal layer has an atomic ratio of silver of 90% or more.

3. The conductive laminate according to claim 1, wherein the transparent substrate comprises glass, polyethylene terephthalate (PET), polyethylene naphthalate (PEN), polyaramid, polyimide, polycarbonate, polyethylene, polypropylene, triacetylcellulose (TAC), and polycycloolefin (COC, COP), or a laminate thereof.

4. An optical device configured by using at least one conductive laminate according to claim 1.

5. A touch panel comprising the conductive laminate according to claim 1 that is used as at least one pole of an electrode.

6. A light control element comprising the conductive laminate according to claim 1 that is used as at least one pole of an electrode.

7. An electrophoretic optical element comprising the conductive laminate according to claim 1 that is used as at least one pole of an electrode.

8. A light emitting element comprising the conductive laminate according to claim 1 that is used as at least one pole of an electrode.

9. An antenna configured by using at least one conductive laminate according to claim 1.

10. A method for manufacturing a conductive laminate, comprising
    a step of laminating a first transparent material layer, a metal layer mainly composed of silver, and a second transparent material layer on at least one surface of a transparent substrate in this order from the transparent substrate side,
wherein the first transparent material layer is composed of a zinc-free metal oxide,
wherein the second transparent material layer is composed of a zinc-containing metal oxide, and
wherein the metal layer has a thickness of 7 nm or more,
wherein transmittance of the conductive laminate as a whole in a lamination direction is 90% or more.

\* \* \* \* \*